(12) United States Patent
Kametani et al.

(10) Patent No.: US 8,687,109 B2
(45) Date of Patent: Apr. 1, 2014

(54) IMAGE CAPTURING DEVICE HAVING PULSED LED FLASH

(75) Inventors: Eiji Kametani, Yamatotakada (JP); Yoshihiko Yamamoto, Yamatokoriyama (JP); Hiroshi Chikugawa, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/496,755

(22) Filed: Jul. 2, 2009

(65) Prior Publication Data

US 2009/0268084 A1  Oct. 29, 2009

Related U.S. Application Data (63) Continuation of application No. 10/909,409, filed on Aug. 3, 2004, now abandoned.

(30) Foreign Application Priority Data

Aug. 4, 2003 (JP) ................................. 2003-286030
Jun. 11, 2004 (JP) ................................. 2004-174230

(51) Int. Cl.
*H04N 5/222* (2006.01)
*F21V 7/04* (2006.01)
*H01L 33/00* (2010.01)

(52) U.S. Cl.
USPC .............................. 348/371; 257/99; 362/555

(58) Field of Classification Search
None
See application file for complete search history.

(56) References Cited

U.S. PATENT DOCUMENTS

| | | | |
|---|---|---|---|
| 5,990,497 A * | 11/1999 | Kamakura et al. | 257/94 |
| 6,005,616 A | 12/1999 | Itoh et al. | |
| 6,375,340 B1 * | 4/2002 | Biebl et al. | 362/294 |
| 6,791,259 B1 * | 9/2004 | Stokes et al. | 313/503 |
| 6,909,123 B2 * | 6/2005 | Hayashimoto et al. | 257/98 |
| 7,050,104 B1 | 5/2006 | Nakayama et al. | |
| 7,098,946 B1 | 8/2006 | Koseki et al. | |
| 2001/0015443 A1 * | 8/2001 | Komoto | 257/81 |
| 2002/0079837 A1 * | 6/2002 | Okazaki | 313/512 |
| 2002/0113245 A1 * | 8/2002 | Lin | 257/99 |
| 2002/0132528 A1 * | 9/2002 | Harasawa et al. | 439/630 |
| 2002/0158320 A1 * | 10/2002 | Takekuma | 257/678 |
| 2002/0163001 A1 * | 11/2002 | Shaddock | 257/79 |
| 2002/0191102 A1 | 12/2002 | Yuyama et al. | |
| 2003/0052992 A1 | 3/2003 | Nakata | |
| 2003/0168720 A1 * | 9/2003 | Kamada | 257/666 |
| 2003/0197191 A1 * | 10/2003 | Nitta et al. | 257/99 |
| 2003/0218689 A1 * | 11/2003 | Angeli et al. | 348/370 |
| 2004/0041222 A1 * | 3/2004 | Loh | 257/433 |
| 2004/0051111 A1 * | 3/2004 | Ota et al. | 257/98 |

FOREIGN PATENT DOCUMENTS

| | | |
|---|---|---|
| JP | 63-274934 A | 11/1988 |
| JP | 5-328210 A | 12/1993 |
| JP | 11-45958 A | 2/1999 |
| JP | 2002-116481 A | 4/2002 |
| JP | 3093684 U | 2/2003 |

\* cited by examiner

*Primary Examiner* — Albert Cutler
(74) *Attorney, Agent, or Firm* — Birch, Stewart, Kolasch & Birch, LLP (57) ABSTRACT

An image capturing device employing as illumination source(s) (flash apparatus(es)) a plurality of light emitting diodes emitting light of different colors; wherein such light emitting diodes are respectively made to emit light in pulsed fashion in turn by emitted color during exposure time(s). Furthermore, during exposure time(s), such light emitting diodes may be made to sequentially emit light in pulsed fashion in turn by emitted color, and/or such light emitting diodes may be made to sequentially emit light in pulsed fashion in turn by emitted color over multiple iterations.

4 Claims, 7 Drawing Sheets

FIG.5 (a) Opening and Closing of Shutter

FIG.5 (b) LED Illumination

FIG.6 (a) Opening and Closing of Shutter

FIG.6 (b) LED Illumination

FIG. 7 (a) Opening and Closing of Shutter

FIG. 7 (b) LED Illumination

IMAGE CAPTURING DEVICE HAVING PULSED LED FLASH

BACKGROUND OF INVENTION

This application is a Continuation application of U.S. application Ser. No. 10/909,409 filed on Aug. 3, 2004, now abandoned which claims priority under 35 U.S.C. §119(a) to Patent Application No. 2003-286030 filed in Japan on Aug. 4, 2003, and 2004-174230 filed in Japan on Jun. 11, 2004, all of which are hereby expressly incorporated by reference into the present application.

This application claims priority under 35 USC 119(a) to Patent Application No. 2004-174230 filed in Japan on 11 Jun. 2004, the content of which is incorporated herein by reference in its entirety.

The present invention relates to such image capturing devices as movie-type equipment, CCD cameras, CMOS imagers, and silver halide cameras employing LED device(s) as illumination source(s); and in particular, relates to image capturing devices permitting increased effective luminance of illumination source(s) employing LED device(s).

Use of R, G, and B light emitting diodes (LEDs) as illumination light source (flash apparatus) for cameras has been proposed conventionally (see, e.g., Japanese Patent Application Publication Kokai No. 2002-116481). As compared with xenon discharge tubes and the like, use of R, G, and B LEDs is advantageous because adjustment of light source color temperature is facilitated, less time is required for power supply charging and discharging, and so forth.

Furthermore, known in connection with cinematic light sources or stroboscopic light sources for cameras for capturing images of moving subjects is a usage wherein light source(s) is/are sequentially lit (see, e.g., Japanese Patent Application Publication Kokai No. H5-328210 (1993) or Japanese Patent Application Publication Kokai No. S63-274934 (1988)). Here, light of identical color is sequentially emitted synchronously with respect to shutter timing.

However, when attempting to use LED(s) as flash apparatus(es) as in the aforementioned conventional art, there has been the problem that luminance has been insufficient. This fact will be described with reference to FIG. 8.

Figure 8:
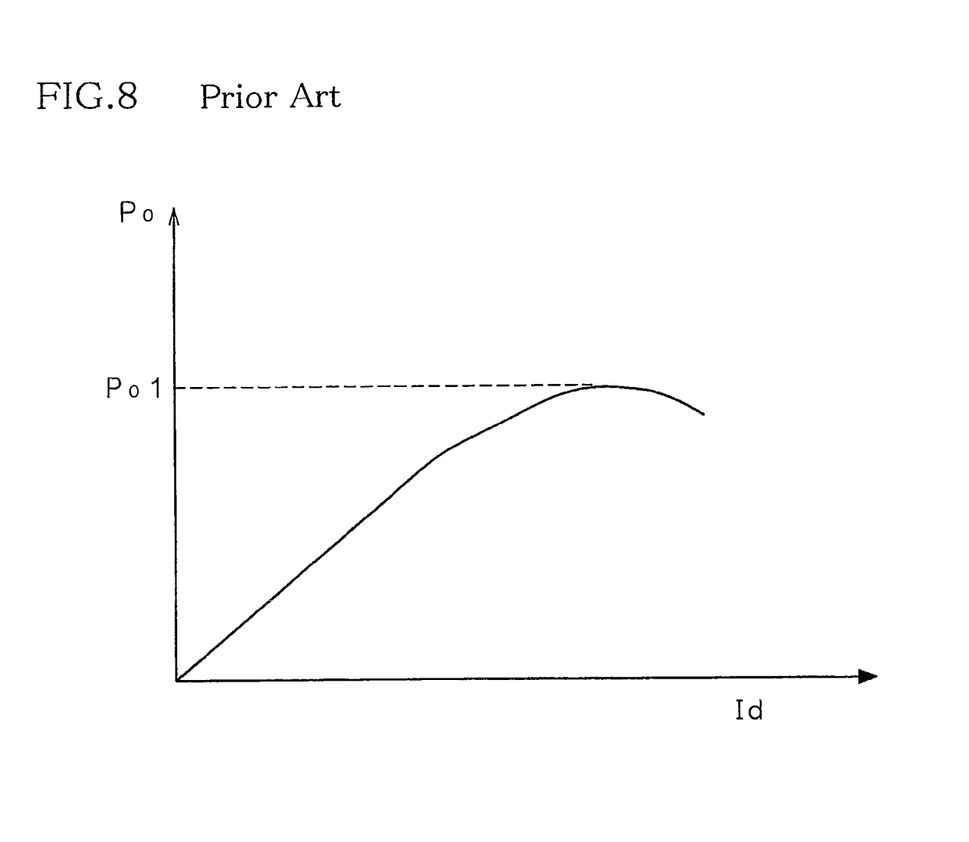
FIG. 8 is a graph (Id-Po characteristics) showing the relationship between LED drive current Id and luminance (optical output Po) in the conventional art.

FIG. 8 is a graph (Id-Po characteristics) showing the relationship between LED drive current Id and luminance (optical output Po) in the conventional art.

As shown in FIG. 8, LED luminance (optical output Po) is roughly proportional to electric current (drive current Id) when the amount of current flowing through the LED is small. Here, the constant of proportionality is referred to as the luminous efficiency $\eta(=\Delta Po/\Delta Id)$. When drive current Id is large, $\eta$ decreases due to generation of heat by the LED element, and optical output Po saturates at maximum value Po1 as indicated by the curve shown in FIG. 8. That is, no matter how large LED drive current is made, LED luminance does not exceed some fixed limit; and it is consequently impossible to obtain luminance as necessary for flash use.

Specific numerical values for generation of heat by chip-type LED elements follow. Results of measuring respective R, G, and B LED elements indicated, for example, that whereas junction temperature Tj for respective LED elements was between 34° and 44° C. and power consumption Pd was between 40 mW and 78 mW when Id=20 mA, junction temperature Tj was between 49° and 71° C. and power consumption Pd was between 110 mW and 230 mW when Id=50 mA. Because there is almost no change in the voltage applied at the respective LEDs, power consumption Pd should be roughly proportional to drive current Id absent any effect due to generation of heat. That is, if drive current Id increases by a factor of 2.5 in going from 20 mA to 50 mA, then power consumption Pd should also increase by a factor of 2.5, going from between 40 mW and 78 mW to between 100 mW and 195 mW. And yet, power consumption Pd actually increases by more than a factor of 2.5.

When used as a camera flash, because drive current Id will reach far greater value(s), at on the order of 200 mA for each LED element of each respective color, the effect of the heat generated thereby will be even more serious. Moreover, there has also been the problem that over the course of usage the resin that encapsulates the LED element(s) can crack due to heat (cracking) and/or separation thereof from package(s) may occur.

The present invention was conceived in light of such problems in the conventional art, and provides, in its various embodiments, an image capturing device permitting increased effective luminance of camera flash(es) employing LED(s). It also provides an image capturing device that will simultaneously permit increased flash effective luminance as well as increased life of LED(s) employed and so forth.

SUMMARY OF INVENTION

In accordance with the above, an image capturing device in accordance with one or more embodiments of the present invention may comprise a plurality of light emitting diodes used as one or more illumination sources and respectively emitting light of different colors; plurality of light emitting diodes used as one or more illumination sources and respectively emitting light of different colors; wherein the plurality of light emitting diodes are respectively made to emit light in pulsed fashion in turn by emitted color during one or more exposure times.

Here, as the plurality of light emitting diodes emitting light of different colors, combination(s) of light emitting diodes emitting red, green, and blue (the colors referred to as "the three primary colors") may, for example, be cited. Use of the three primary colors will make it possible to faithfully reproduce the color balance of the photographic subject. Where the image capturing device is equipped with mechanical and/or electrical shutter(s), exposure time(s) may correspond to time(s) during which such shutter(s) is/are open (as determined by shutter speed(s)). While the timing with which light emitting diode(s) is/are made to emit light may be such that timing(s) of each emitted color is/are completely different from that or those of the other(s), the timing with which any two colors, for example, are emitted may partially or completely overlap.

In image capturing device(s) in accordance with embodiment(s) of the present invention, because plurality of light emitting diodes used as illumination source(s) are not driven continuously throughout entire exposure time(s) but are driven in pulsed fashion in turn by emitted color, it is possible to suppress generation of heat by light emitting diode element(s) and reduce adverse effect(s) on luminous efficiency, making it possible to achieve higher light emitting diode drive current value(s) at which optical output saturates than would be the case had light emitting diode(s) been driven continuously. As a result, increased luminance of light-emitting-diode illumination source(s) is permitted; this being suited, for example, to use in applications such as where compensation of backlighting is carried out at bright locations. As a result of suppression of generation of heat by light emitting diode element(s), it is also possible to achieve increased light emitting diode element life, improved reliability, and so forth.

Furthermore, in image capturing device(s) in accordance with embodiment(s) of the present invention, the plurality of light emitting diodes may be made to sequentially emit light in pulsed fashion in turn by emitted color during at least one of the exposure time or times. Moreover, the plurality of light emitting diodes may be made to sequentially emit light in pulsed fashion in turn by emitted color over multiple iterations during at least one of the exposure time or times.

Furthermore, in image capturing device(s) in accordance with such embodiment(s) of the present invention, plurality of light emitting diodes used as illumination source(s) may be sequentially driven in pulsed fashion in turn by emitted color. It is possible to suppress generation of heat by light emitting diode element(s) itself or themselves and to suppress effect(s) of generation of heat exerted between or among light emitting diode elements of different emitted colors, making it possible to achieve higher light emitting diode drive current value(s) at which optical output saturates than would be the case had light emitting diode(s) been driven continuously. As a result, increased luminance of light-emitting-diode illumination source(s) is permitted; this being favorable, for example, for compensation of backlighting at bright locations. Furthermore, because light emitting diode(s) of each color may be driven with different timing(s), it is possible to avoid placing excessive load(s) on image capturing device power supply or supplies. Moreover, in the event that sequential lighting of the plurality of light emitting diodes in turn by emitted color is made to occur over multiple iterations, width(s) of drive pulse(s) for each luminous emission of each iteration may be made shorter. This makes it possible to further suppress generation of heat by light emitting diode element(s), permitting further increase in luminance of light-emitting-diode illumination source(s).

Furthermore, in image capturing device(s) in accordance with embodiment(s) of the present invention, one or more image capturing elements in the image capturing device may be electronic; in correspondence to at least one timing with which the plurality of light emitting diodes are made to emit light in turn by emitted color, one or more monochromatic images corresponding to at least one of the emitted color or colors may be respectively acquired by at least a portion of the image capturing element or elements; and one or more color images may be formed by combining at least a portion of the respective acquired monochromatic image or images.

Here, whereas with conventional electronic image capturing element(s) a full-color signal might be obtained by applying red filter(s), green filter(s), and/or the like at individual element(s), where image capturing device(s) in accordance with embodiment(s) of the present invention is/are employed it may be possible to do without filter(s) at individual element(s). Monochromatic images respectively corresponding to colors emitted by LED elements may be acquired through a method in which, for example, only red signal(s) is/are integrated while R LED element(s) is/are emitting light, and only green signal(s) is/are integrated while G LED element(s) is/are emitting light.

Furthermore, with image capturing device(s) in accordance with such embodiment(s) of the present invention, because it is possible to do without filter(s) at individual element(s), all image capturing elements may be utilized in acquiring monochromatic image(s). This being the case, where the same image capturing element(s) is/are used it will be possible to obtain color image(s) having three times the resolution, or if color image(s) of the same resolution is/are to be obtained it will be sufficient to use one-third the number of image capturing elements.

Furthermore, in image capturing device(s) in accordance with embodiment(s) of the present invention, at least one luminous intensity and at least one total illumination time for each of the plurality of light emitting diodes during at least one of the exposure time or times may respectively be made variable. Moreover, at least one luminous intensity and at least one total illumination time for each of the plurality of light emitting diodes during at least one of the exposure time or times may be varied, altering at least one ratio between or among luminous intensity time integrals of at least a portion of the respective colors. Alternatively, at least one luminous intensity and at least one total illumination time for each of the plurality of light emitting diodes during at least one of the exposure time or times may be varied by at least one substantially identical ratio.

With image capturing device(s) in accordance with such embodiment(s) of the present invention, where it is possible to vary luminous intensity or intensities and total illumination time(s) for plurality of light emitting diodes used as illumination source(s), altering ratio(s) between or among luminous intensity time integrals of respective colors, it will be possible to adjust illumination source color balance(s). Furthermore, by varying luminous intensity or intensities and total illumination time(s) for respective color(s) by substantially identical ratio(s), it will be possible to adjust total exposure dose(s) produced by illumination source(s) while maintaining illumination source color balance(s).

Furthermore, image capturing device(s) in accordance with embodiment(s) of the present invention may further comprise one or more luminous energy detection means for detecting light incident thereon after passing through one or more photographic lenses of the image capturing device; at least one of the illumination source or sources may be made to emit light prior to at least one of the exposure or exposures; and one or more exposure conditions may be set based on at least one result of detection carried out by at least one of the luminous energy detection means at at least one time when at least one of the illumination source or sources is made to emit light prior to at least one of the exposure or exposures. Moreover, the exposure condition or conditions set based on at least one result of detection carried out by at least one of the luminous energy detection means may include at least one shutter speed.

With image capturing device(s) in accordance with such embodiment(s) of the present invention, effect(s) of illumination by illumination source(s) may be accurately detected prior to exposure(s), and exposure condition(s) (e.g., exposure time(s) as determined by shutter speed(s) and/or the like) may be appropriately set based on result(s) of such detection. This being the case, it will be possible for exposure time during flash photography, determined conventionally based on flash intensity or the like, to be accurately determined by means of exposure control apparatus(es) internal to image capturing device(s) in similar manner as was the case with ordinary photography.

Furthermore, in image capturing device(s) in accordance with embodiment(s) of the present invention, at least one illuminative locus of at least one of the illumination source or sources may be varied in correspondence to at least one photographic field angle of the image capturing device. Moreover, at least one of the illumination source or sources may have a plurality of light emitting diodes respectively irradiating light in different directions.

Here, as method for varying illuminative locus or loci of illumination source(s), a method in which variable-magnification optical system(s) is/are arranged in front of illumination source(s), magnification-varying operation(s) of such variable-magnification optical system(s) being linked to change(s) in photographic field angle(s) of image capturing device(s), may for example be cited. Alternatively, plurality of light emitting diodes may be arranged such that directions in which light is irradiated thereby are different, such light emitting diodes being selectively made to emit light in linked fashion with change(s) in photographic field angle(s) such that only light emitting diode(s) corresponding to location(s) within photographic field angle(s) is/are made to emit light.

Image capturing device(s) in accordance with such embodiment(s) of the present invention make it possible to achieve appropriate illumination in correspondence to change(s) in photographic field angle(s) of image capturing device(s). Causing plurality of light emitting diodes to be selectively made to emit light in linked fashion with change(s) in photographic field angle(s) such that only light emitting diode(s) corresponding to location(s) within photographic field angle(s) is/are made to emit light makes it possible to eliminate waste and so forth associated with illumination of location(s) outside photographic field angle(s) by light emitting diode(s).

DESCRIPTION OF PREFERRED EMBODIMENTS

Below, embodiments of the present invention are described with reference to the drawings.

-First Embodiment-

Figure 1:
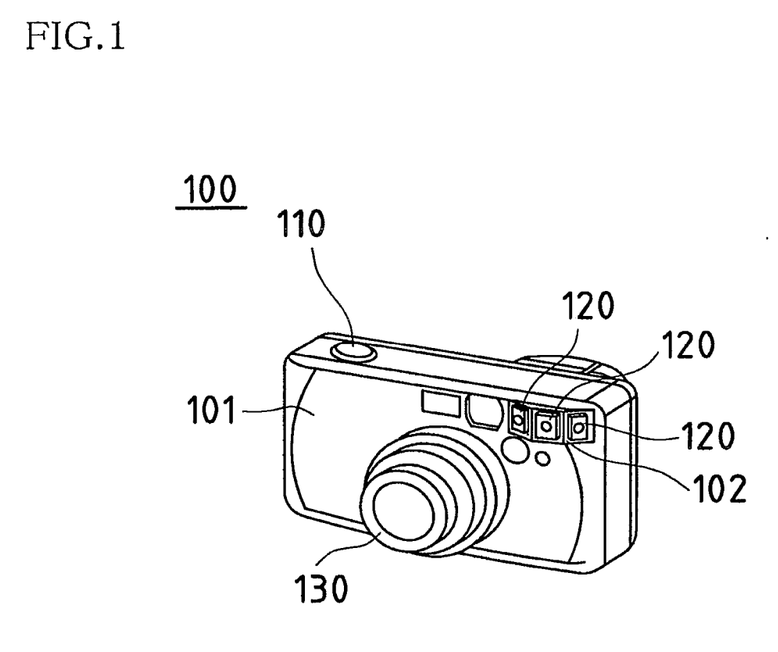
FIG. 1 is a drawing showing the external appearance of a camera associated with a first embodiment of the image capturing device of the present invention.

FIG. 1 is a drawing showing the external appearance of a camera associated with a first embodiment of the image capturing device of the present invention. Note that this camera is assumed to use silver halide film.

As shown in FIG. 1, photographic lens 130 equipped with multibarrel lens barrel is arranged toward the bottom in roughly the central region of the front of body 101 of squat box-shaped camera 100. This photographic lens 130 can be extended and/or retracted as a result of actuation by actuating member(s), not shown; extension and/or retraction of photographic lens 130 permitting change in photographic magnification. Three LED devices 120 for flash use are arranged at protruding region 102 formed in the upper right region at the front of camera body 101. These LED devices 120 for flash use are arranged so as to permit light to respectively be irradiated centrally within the field angle of photographic lens 130 as well as to the left and right thereof. Arranged near the left edge of the top of camera body 101 is shutter button 110, actuation of this shutter button 110 causing photograph(s) to be taken by camera 100.

During telephoto photography as takes place when photographic lens 130 is in its extended state, only the one flash LED device that is centrally disposed among the three flash LED devices 120 is made to irradiate light. The reason for this is that because photographic field angle is narrow during telephoto photography, locations within the photographic field angle can be adequately irradiated when only the one flash LED device that is centrally disposed among the three flash LED devices 120 is made to irradiate light. Conversely, during wide-angle photography as takes place when photographic lens 130 is in its retracted state, because photographic field angle is wide, all of the three flash LED devices 120 are made to irradiate light. Note that the present invention is not limited to the number, arrangement, and so forth of flash LED devices 120 presented here.

Whereas flash LED devices 120 are for clarity depicted as protruding from camera body 101 at FIG. 1, these may be internal to camera body 101, protruding region 102, and/or the like. Furthermore, variable-magnification optical system(s) may be arranged in front of flash LED device(s) 120, and magnification-varying operation(s) of such variable-magnification optical system(s) may be linked to change(s) in photographic field angle(s) accompanying extension and/or retraction of photographic lens 130 so as to alter illuminative locus or loci of flash LED device(s) 120. Moreover, to cause illuminative locus or loci to be more uniformly illuminated, constitutions such as that in which diffuser plate(s) is/are provided in front of flash LED device(s) 120 may be adopted.

FIG. 2(a) is a top view showing constitution of LED devices for flash use in a camera associated with a first embodiment of the image capturing device of the present invention; and FIG. 2(b) is a view of section II-II indicated in FIG. 2(a).

As shown at FIG. 2(a), at flash LED device 120, red LED element 8, blue LED element 9, and green LED element 10 are housed within a single package 20 which is box-like in shape and has cross-section in the shape of a square with rounded corners.

Lead frames 1, 2, 3 and lead frames 4, 5, 6 are arranged in mutual opposition at the lower portion of package 20. These lead frames 1 through 6 are made to form an integral structure as a result of conventional insert molding with Amodel or other such white resin 11 making up the upper portion of package 20. Recess 20a, in the shape of a round, shallow bowl of diameter slightly smaller than package 20, is formed at the top of package 20 so as to expose respective portions of lead frames 1 through 6, and serves as location for receiving resin as well as for wire bonding. Note that sidewall 20b of recess 20a also serves as reflecting surface. Furthermore, notch 20c is formed at a top corner of package 20 above lead frame 4, making it possible to determine the orientation of package 20 from the external appearance of package 20.

Rectangular-chip-type red LED element 8, blue LED element 9, and green LED element 10 are respectively mounted on lead frames 3, 5, and 1 at respective locations thereof exposed within recess 20a. Red LED element 8 which is mounted on lead frame 3 is electrically connected by wire bonding by way of metal wire 7a to lead frame 6 which is arranged opposite lead frame 3 and serves as the other electrode paired therewith. Blue LED element 9 which is mounted on lead frame 5 is electrically connected by wire bonding by way of metal wire 7b to lead frame 2 which is arranged opposite lead frame 5 and serves as the other electrode paired therewith. Moreover, green LED element 10 which is mounted on lead frame 1 is electrically connected by wire bonding by way of metal wire 7c to lead frame 4 which is arranged opposite lead frame 1 and serves as the other electrode paired therewith. In addition, after the respective LED elements have been mounted thereon and wire bonding has been carried out, recess 20a of package 20 is encapsulated with epoxy-type transparent resin 12, preventing deterioration of the respective LED elements.

Here, red LED element 8, blue LED element 9, and green LED element 10 are arranged so as to be as close to each other as possible in order to facilitate mixing of colors (improve color mixture characteristics) of the respective LED elements. That is, consideration may be made for causing distances between and/or among lead frames to be as small as possible, for arranging respective LED elements at the vertices of a roughly equilateral triangle, and/or the like. On the other hand, to improve heat dissipation, for a given area at the floor of recess 20a, lead frame area at the side on which the chip is mounted may be made as large as possible, while lead frame area at the side to which the wire is directly bonded may be made small. To further improve color mixture characteristics, transparent resin 12 may be made to contain filler(s) and/or void(s).

Furthermore, as shown at FIG. 2(b), thickness of lead frame 5, on which blue LED element 9 is mounted, is different at the region 5a thereof at which blue LED element 9 is mounted than it is for other locations thereof. More specifically, whereas thickness T2 of mounting region 5a is on the order of 0.5 mm to 0.6 mm, thickness T1 at other locations is on the order of 0.3 mm; the reason for which is as follows.

Where an LED element is made to emit light as a result of being driven in CW (Continuous Wave) fashion (i.e., where it is being driven continuously), because heat is being constantly supplied from the LED element, the amount of heat that can be made to flow therefrom will be determined by that location in the entire region delimited by the LED element on the one hand and the external circuitry on the other that has the poorest heat dissipation characteristics. Accordingly, there would be little point in making the entire lead frame anything other than the same thickness. On the other hand, where an LED element is made to emit light as a result of being driven in pulsed fashion, LED element heat dissipation can be improved if the lead frame is made thicker at the LED element mounting region. This is because, unlike the situation in which the LED element is being driven in CW fashion, supply of heat from the LED element is intermittent; making it possible for heat produced when the LED element is emitting light to be quickly dissipated into the frame which has good thermal conduction, preventing a rise in temperature, and for heat to be released to the exterior by way of the lead when the LED element is not emitting light.

Furthermore, if the lead frame is made thick, then a great deal of force will be required during cutting thereof, making formation of a gap at the region of the cut unavoidable. Where this is the case, it will only be possible during working thereof to achieve a distance between lead frames that is on the same order as the thickness thereof or possibly on the order of three-fourths of the thickness thereof. Accordingly, where distance between lead frames is to be made small in order to improve color mixture characteristics, it will not be possible to employ lead frames that are very thick. And it will also be necessary to keep the lead frame thin at locations thereof at which the LED element is not mounted so as to avoid difficulty when the lead frame is bent into shape.

Note at FIGS. 2(a) and (b) that the dimensions and arrangement of the lead frames and the arrangement of the respective LED elements are examples for purposes of illustration, and the present invention is not limited thereto.

Next, the effect of heat dissipation on maximum LED optical output is described in detail with reference to the drawings.

Figure 3:
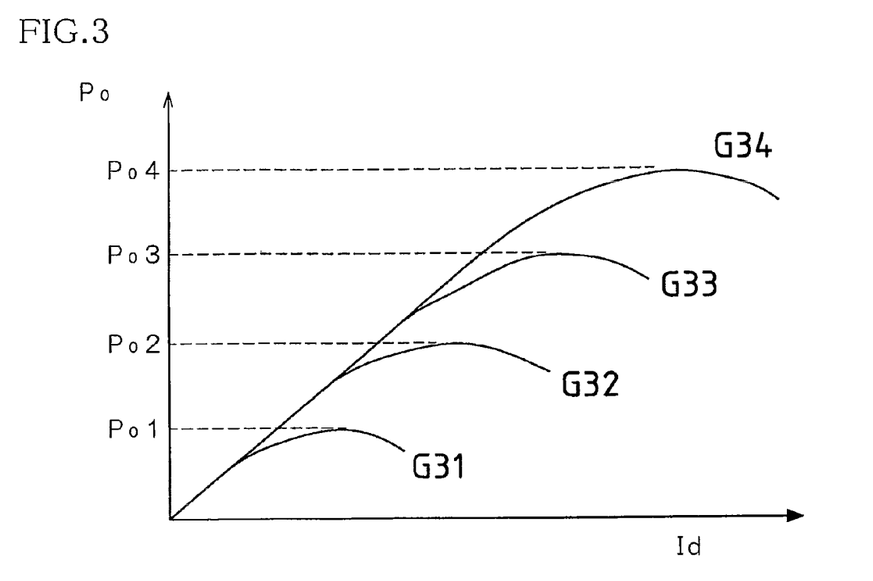
FIG. 3 is a graph (Id-Po characteristics) showing the manner in which the relationship between LED drive current Id and optical output Po might change with changing LED drive pulsewidth and so forth.

FIG. 3 is a graph (Id-Po characteristics) showing the manner in which the relationship between LED drive current Id and optical output Po might change with changing LED drive pulsewidth and so forth.

As shown in FIG. 3, curve G31, indicating Id-Po characteristics of one LED among three LEDs (these being R, G, and B) when these are driven simultaneously in CW fashion to produce emission of white light, has maximum optical output Po1. Curves G32 and G33, respectively indicating Id-Po characteristics of any one among the R, G, and B LEDs when driven with drive pulsewidth 2 msec and 0.2 msec, respectively have maximum optical outputs Po2 and Po3. At curve G34, LED drive conditions per se are identical to those at curve G33, but the Id-Po characteristics indicated are for when the thickness in the region of the lead frame at which the LED chip is mounted is 0.6 mm, this being greater than at other locations.

Curves G31 through G34 all indicate that optical output Po is roughly proportional to drive current Id when LED drive current Id is small, but that optical output Po begins to saturate as drive current Id grows larger. When an LED is driven in CW fashion to cause it to emit light, as indicated by curve G31, output saturates at roughly the same optical output Po1 regardless of the thickness at the frame region at which the LED chip is mounted.

On the other hand, when LED drive pulsewidth is 2 msec (1/500 of a second), as indicated by curve G32, maximum optical output Po2 reaches twice the value of Po1 or more. When drive pulsewidth is shortened to 0.2 msec (1/5000 of a second), maximum optical output Po3 reaches almost four times the value of Po1. Moreover, when the thickness of the frame in the region at which the LED chip is mounted is made 0.6 mm, this being greater than at other locations thereof, maximum optical output Po4 reaches almost six times the value of Po1. That is, when one color of light is emitted at a time with LED drive pulsewidth set to 0.2 msec and the thickness of the frame in the region at which the LED chip is mounted is 0.6 mm, saturation does not occur until optical output Po reaches almost six times the value of the maximum optical output Po1 applicable to the situation in which the three colors of LEDs are simultaneously made to emit light in continuous fashion.

Figure 4:
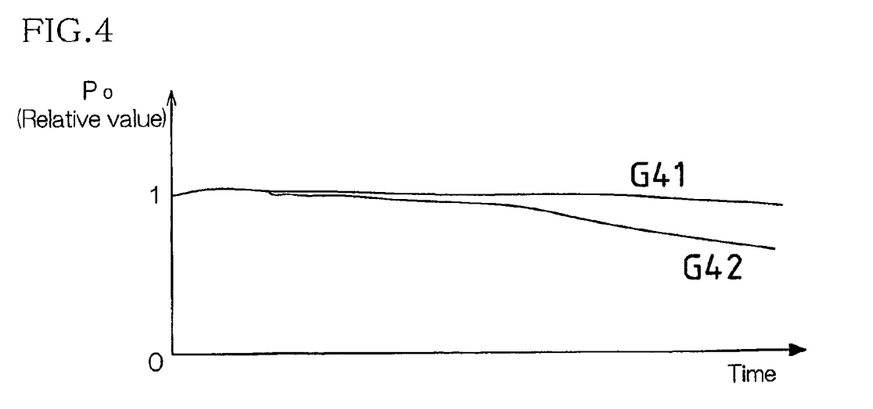
FIG. 4 is a graph showing change in optical output Po over time when LED element drive current is held constant.

FIG. 4 is a graph showing change in optical output Po over time when LED element drive current is held constant. Curve G41 indicates driving in pulsed fashion, and curve G42 indicates driving in CW fashion, total amount of luminous energy being the same in either case.

The reason that as shown in FIG. 4 optical output falls off more rapidly for CW drive than for pulsed drive is thought to be due to the fact that separation of encapsulant resin occurring as result of the effect of heating accompanying emission of light by LED element(s) causes occurrence of optical losses at the interface between resin and air, and due to the fact that exposure of LED element(s) to air as a result of separation of encapsulant resin promotes deterioration of LED element(s).

Figure 5:
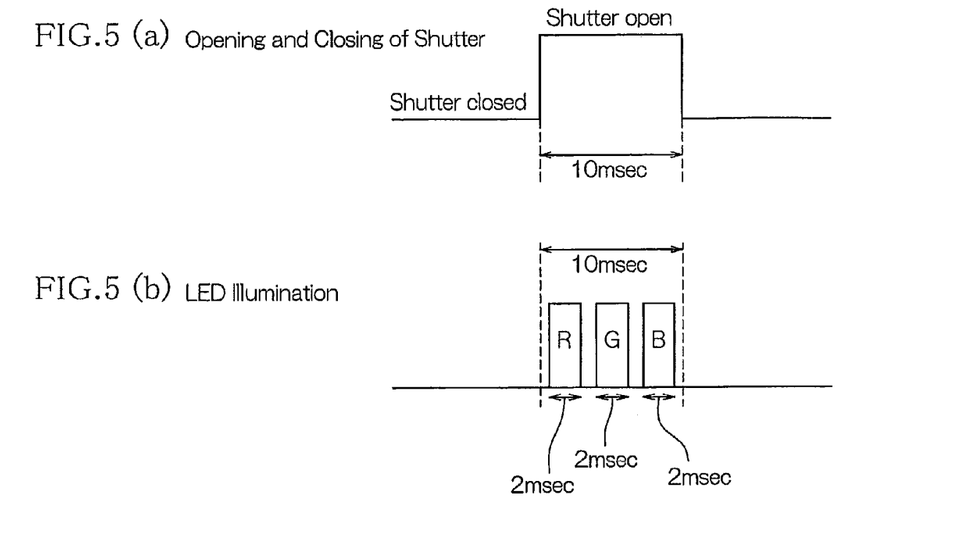
FIG. 5(a) indicates when a shutter might be open and when it might be closed in an example of a drive signal timing chart for LEDs for flash use in a camera associated with a first embodiment of the image capturing device of the present invention.
FIG. 5(b) shows the corresponding LED drive signals.

FIG. 5(a) indicates when a shutter might be open and when it might be closed in an example of a drive signal timing chart for LEDs for flash use in a camera associated with a first embodiment of the image capturing device of the present invention; and FIG. 5(b) shows the corresponding LED drive signals. Note as mentioned above that this camera is assumed to use silver halide film.

As shown at FIG. 5(a), it will be assumed for purposes of discussion that during flash photography the time during which the camera shutter is open might conventionally be on the order of 1/100 of a second. As shown at FIG. 5(b), when LED elements of respective colors R, G, and B are sequentially made to emit light with different timings but such that each is made to emit light for 2 msec, it is possible to make each LED element in its turn emit light in pulsed fashion over one iteration during the time when the shutter is open.

At the silver halide film or other such image capturing element(s), because light is in effect being integrated over the time during which exposure is taking place while the shutter is open, regardless of whether light of respective colors R, G, and B is irradiated with different timings it will be as if exposure had been caused by light of color corresponding to the relative intensities thereof. For example, sepia-colored exposure might be carried out by lowering B intensity. This fact is not limited to situations in which the image capturing element is silver halide film, but is similarly true for CCD(s) and other such electronic device(s) provided integration occurs in electrical fashion.

Here, the total exposure dose imparted when R, G, and B LED elements are made to emit light as a result of being driven simultaneously in CW fashion throughout the entire exposure time during which the shutter is open (10 msec) is taken to be 1. But when the LED elements of the respective colors are each in its turn separately made to emit light for a drive pulsewidth of 2 msec over one iteration, where maximum optical output Po is held to the same value the total exposure dose obtained as determined by the fraction of time that each LED is emitting light (2 msec/10 msec) will be only 1/5.

However, as has been described with reference to FIG. 3, where each LED element is made to emit light for a drive pulsewidth of 2 msec (curve G32 in FIG. 3), it is possible to achieve a maximum optical output Po that is two or more times the value that would be obtained were driving to have been carried out in CW fashion to produce emission of light. Accordingly, a total exposure dose of up to on the order of 2/5 can be attained. Because the value of the time integral of electric current which is required need only be on the order of 2/5 that which would be required had driving been carried out in CW fashion, this is suited, for example, to use in applications such as where compensation of backlighting is carried out at bright locations.

Moreover, because LED elements of respective colors are driven with different timings, it is possible to avoid situations such as occur when respective LEDs are driven simultaneously and drive currents Id overlap, with excessive load being placed on image capturing device power supply or supplies. Or it will be possible by driving LED elements with different timings to obtain higher drive current(s) Id without placing excessive load on image capturing device power supply or supplies than would be the case were the LED elements driven simultaneously.

Moreover, settings affecting LED drive currents Id, illumination timings, and illumination times for respective colors R, G, and B are made variable.

In order to adjust flash color balance, LED drive currents Id for respective colors R, G, and B may be varied over range(s) within which optical output(s) Po do not saturate so as to alter ratio(s) between or among luminescent intensities of respective colors, and/or ratio(s) between or among total illumination times for respective colors may be varied while LED drive currents Id for respective colors are left unchanged. Or alteration of ratio(s) between or among total illumination times for respective colors may be combined with alteration of LED drive currents Id for respective colors. In this way, it is possible to alter ratio(s) between or among exposure doses (time integrals of luminescent intensity) for respective colors, flash color balance being determined by ratio(s) between or among exposure doses for respective colors as modified by such alteration.

Furthermore, adjustment of total exposure dose(s) produced by flash(es) may be accomplished by causing LED drive currents Id for respective colors to be altered by the same ratio, by causing total illumination times for respective colors to be altered by the same ratio, or by combination of these types of alteration. In this way, it is possible to alter total exposure dose(s) produced by flash(es) while preserving flash color balance.

Figure 6:
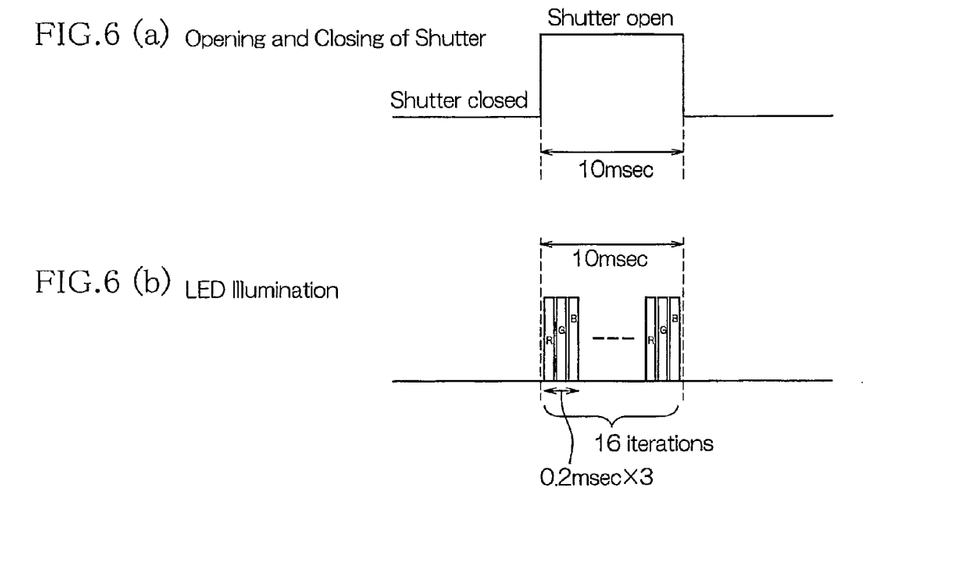
FIG. 6(a) indicates when a shutter might be open and when it might be closed in another example of a drive signal timing chart for LEDs for flash use in a camera associated with a first embodiment of the image capturing device of the present invention.
FIG. 6(b) shows the corresponding LED drive signals.

FIG. 6(a) indicates when a shutter might be open and when it might be closed in another example of a drive signal timing chart for LEDs for flash use in a camera associated with a first embodiment of the image capturing device of the present invention; and FIG. 6(b) shows the corresponding LED drive signals.

As shown at FIG. 6(a), it will be assumed for purposes of discussion that during flash photography the time during which the camera shutter is open is the same as at FIG. 5(a), this being on the order of 1/100 of a second. As shown at FIG. 6(b), when respective LED elements are made to emit light with different timings, sequentially emitting light for 0.2 msec over multiple iterations, it is possible to make LED elements of respective colors R, G, and B each in its turn emit light in pulsed fashion over 16 iterations during the time when the shutter is open.

Here, the total exposure dose imparted when R, G, and B LED elements are made to emit light as a result of being driven simultaneously in CW fashion throughout the entire exposure time during which the shutter is open (10 msec) is taken to be 1. But when the LED elements of the respective colors are each in its turn separately made to emit light with drive pulsewidth equal to 0.2 msec over 16 iterations, where maximum optical output Po is held to the same value the total exposure dose obtained as determined by the fraction of time that each LED is emitting light (16×0.2 msec/10 msec) will be only 0.32.

However, as has been described with reference to FIG. 3, where each LED element is made to emit light for a drive pulsewidth of 0.2 msec (curve G33 in FIG. 3), it is possible to achieve a maximum optical output Po that is four or more times the value that would be obtained were driving to have been carried out in CW fashion to produce emission of light. Accordingly, a total exposure dose of up to on the order of 1.3 (≅4×0.32) can be attained. Moreover, when the thickness of the frame in the region at which the LED chip is mounted is made 0.6 mm (curve G34 in FIG. 3), this being greater than at other locations thereof, it is possible to achieve a maximum optical output Po that is six or more times the value that would be obtained were driving to have been carried out in CW fashion to produce emission of light. As a result, total exposure dose can be increased to on the order of 2 ($\cong 6\times 0.32$), permitting use as a flash of higher effective luminance.

Figure 2:
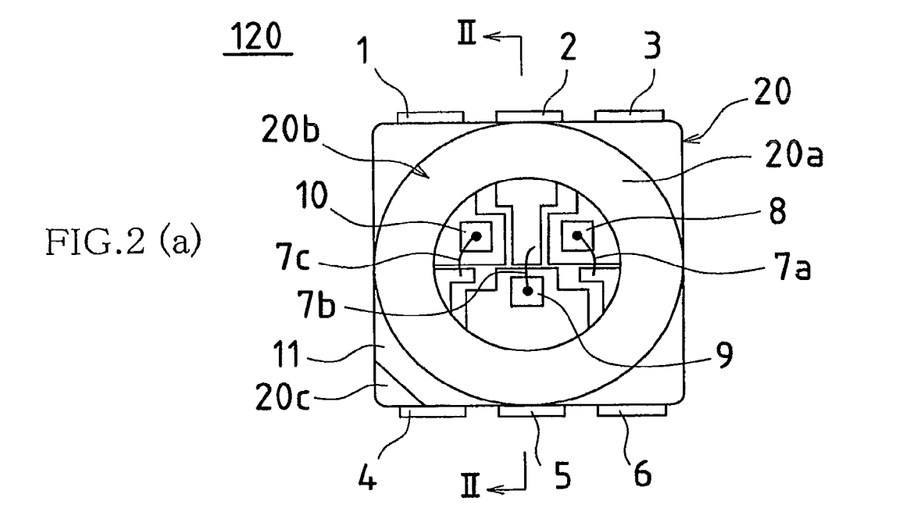
FIG. 2(a) is a top view showing constitution of LED devices for flash use in a camera associated with a first embodiment of the image capturing device of the present invention.
FIG. 2(b) is a view of section II-II indicated in FIG. 2(a).

Moreover, with regard to the order in which respective LED elements are made to emit light at such time, by causing R (red LED element 8 at FIG. 2(*a*)) and G (green LED element 10 at FIG. 2(*a*)), which are disposed to either side within package 20 (see FIG. 2(*a*)), to emit light in sequence first and by causing B (blue LED element 9 at FIG. 2(*a*)) to emit light last, it will be possible to further reduce the effect of heating, since heat produced by R is not readily conveyed to G, which emits light immediately after emission of light by R. In addition, by mounting the G LED element, which generates a large amount of heat, at one side rather than in the center of package 20, it is possible to avoid the effects that generation of heat by G would otherwise have on the other LED elements.

To further increase total exposure dose, the timing with which two LED elements are made to emit light may be such as to cause them to overlap. By so doing, it may be possible to further increase exposure dose imparted during the time during which exposure is taking place while the shutter is open. In particular, where as shown at FIG. 2(*a*) the locations within the package of the R LED chip and the G LED chip are separated from each other, this method will be effective, since causing the G LED chip to turn ON before the R LED chip has turned OFF will have almost no thermal effect.

Furthermore, although no special mention of this has been made until now, it is also possible to increase exposure dose by increasing the height (i.e., distance from chip mounting surface to package top) of reflecting surface 20*b* (see FIG. 2(*b*)). This effect is particularly marked when reflecting surface height is small; e.g., as compared with a situation where reflecting wall height was 1 mm, increasing reflecting wall height to 2.4 mm caused exposure dose to increase by a factor of 1.5, and increasing reflecting wall height to 2.8 mm caused exposure dose to increase by a factor of 1.8. Note, however, that an increase in reflecting wall height will perforce cause an increase in package width, leading to increase in the amount of white resin. Since it is often the case that white resin is expensive and/or that there is a desire not to increase package width, it may be advantageous to make the package as small as feasible and to instead attach reflector(s) thereto in the form of separate component(s). Where reflector(s) is/are instead thus attached thereto in the form of separate component(s), this will also have the advantage that it increases degrees of freedom with respect to selection of reflecting surface material(s), since many factors will be eliminated from the criteria for selection thereof, including difference in coefficient of thermal expansion relative to frame(s), adhesive characteristics relative to resin(s) used to encapsulate LED element(s), and so forth.

Furthermore, even where emission of light as a result of driving of LEDs in CW fashion could produce an amount of light that is sufficient for flash use, it may still be desirable to cause LEDs to emit light by driving them in pulsed fashion. This is because, as has been described with reference to FIG. 4, pulsed drive better permits suppression of LED element deterioration, making it possible to achieve lengthened LED element life, improved reliability, and so forth.

Whereas the foregoing description was carried out in terms of an image capturing device that was a camera (still-picture camera) employing silver halide film to carry out still-picture photography, the present invention is not limited thereto. For example, the image capturing device may be movie-type equipment capable of carrying out motion-picture photography; in which case, for each motion-picture frame (whether it be film or video), LED(s) used as flash apparatus(es) might be driven in pulsed fashion so as to be made to emit light during the time when the shutter is open.

-Second Embodiment-

Figure 7:
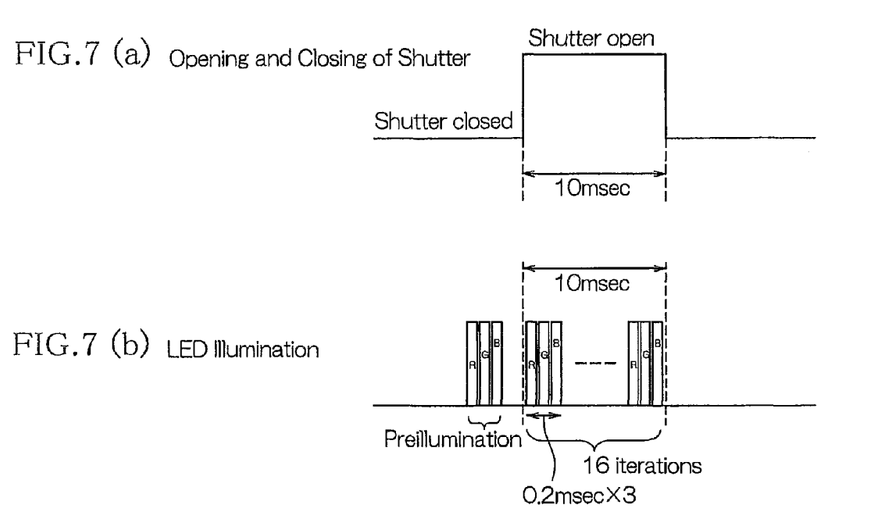
FIG. 7(a) indicates when a shutter might be open and when it might be closed in an example of a drive signal timing chart for LEDs for flash use in a camera associated with a second embodiment of the image capturing device of the present invention.
FIG. 7(b) shows the corresponding LED drive signals.

FIG. 7(*a*) indicates when a shutter might be open and when it might be closed in an example of a drive signal timing chart for LEDs for flash use in a camera associated with a second embodiment of the image capturing device of the present invention; and FIG. 7(*b*) shows the corresponding LED drive signals. Note that because, except for the features mentioned below, the second embodiment is identical to the first embodiment which was described with reference to FIGS. 1 through 6, only those aspects that are different therefrom will be described here.

Internal to this camera is/are monitoring light-receiving element(s) capable of measuring amount(s) of light impinging on image capturing element(s) after passing through photographic lens(es). In the event that LED element(s) is/are used as flash apparatus(es), it is possible, unlike the situation with conventional xenon discharge tubes, to cause light to be emitted in repeated fashion. In the present case as shown at FIGS. 7(*a*) and (*b*), therefore, before the shutter is actually opened (e.g., immediately after the shutter button is pressed), respective R, G, and B LED elements are made to emit light in preliminary fashion at the same conditions (same pulsewidth(s), time(s) between pulses, intensity ratio(s), and so forth) as during flash photography. Moreover, at monitoring light-receiving element(s) internal to the camera, optimum exposure time(s) is/are calculated based on signal output(s) produced as a result of such preillumination, and shutter speed(s) for flash photography is/are determined.

By so doing, it is possible for exposure time during flash photography, determined conventionally based on flash intensity or the like, to be accurately determined by means of exposure control apparatus(es) internal to the camera in similar manner as with conventional photography. Note that in the example shown at FIG. 7(*b*), shutter speed is set so as to obtain a duration that is 16 times the time required for preillumination.

-Other Embodiments-

Figure 9:
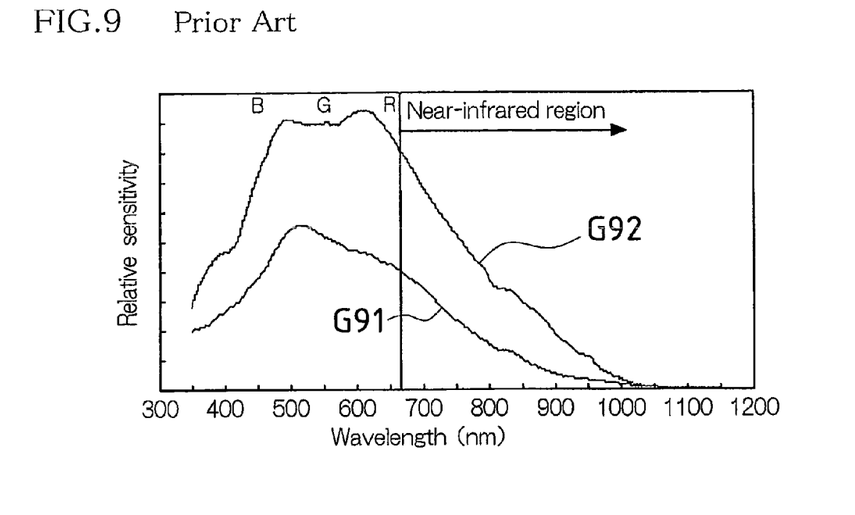
FIG. 9 is a graph showing spectral sensitivity characteristics of conventional CCDs.
Figure 10:
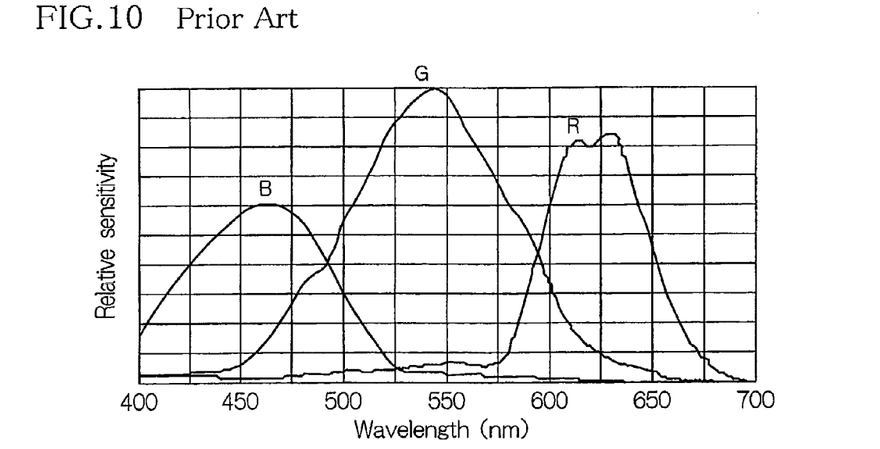
FIG. 10 is a graph showing spectral sensitivity characteristics of a conventional CMOS.

Whereas the foregoing first and second embodiments have been described in terms of cameras employing silver halide film, it goes without saying that these might just as well have been electronic still-picture cameras employing CCD(s), CMOS imager(s), and/or the like as image capturing element(s). Because CCDs, CMOSes, and other such light-receiving elements exhibit varying sensitivity depending upon wavelength, adjustment of gain will be necessary. That is, it is desirable that emission proceed from light of wavelength for which sensitivity is high. For example, taking the case of CCDs, with the conventional CCD (curve G91) shown in FIG. 9, because sensitivity to red is low but sensitivity to blue or green is high, it is desirable that emission of light be made to proceed from the blue LED element or the green LED element. Conversely, with the EXviewHAD CCD (curve G92), because sensitivity is highest with respect to red, it is desirable that emission of light be made to proceed from the red LED element. Or in the case of the conventional CMOS shown in FIG. 10, because sensitivity is highest with respect to green, it is desirable that emission of light be made to proceed from the green LED element.

Whereas even with conventional electronic image capturing element(s) a full-color signal might be obtained by applying red filter(s), green filter(s), and/or the like at individual image capturing element(s), where image capturing device(s)

in accordance with embodiment(s) of the present invention is/are employed it may be possible to do without filter(s) at individual image capturing element(s). Monochromatic images respectively corresponding to colors emitted by LED elements may be acquired through a method in which, for example, only red signal(s) is/are integrated while R LED element(s) is/are emitting light, and only green signal(s) is/are integrated while G LED element(s) is/are emitting light. Because it may be possible to do without filter(s) at individual element(s), all image capturing elements may be utilized in acquiring monochromatic image(s). This being the case, where the same image capturing element(s) is/are used it will be possible to obtain color image(s) having three times the resolution, or if color image(s) of the same resolution is/are to be obtained it will be sufficient to use one-third the number of image capturing elements.

However, where element(s) with filter(s) is/are not employed, there may be a problem in that it may no longer be possible to carry out conventional photography, i.e., photography not accompanied by illumination produced by flash apparatus(es). As one example of how this problem might be solved, element(s) with filter(s) could be employed, sensitivity of red-filtered element(s) with respect to emission of R light, sensitivity of green-filtered element(s) with respect thereto, and so forth being stored in advance in memory, and by employing a method in which signals are integrated in turn by color only during flash photography, it will be possible to enjoy the advantages of ability to obtain higher resolution during flash photography while still being able to carry out conventional photography.

Moreover, the present invention may be embodied in a wide variety of forms other than those presented herein without departing from the spirit or essential characteristics thereof. The foregoing embodiments, therefore, are in all respects merely illustrative and are not to be construed in limiting fashion. The scope of the present invention being as indicated by the claims, it is not to be constrained in any way whatsoever by the body of the specification. All modifications and changes within the range of equivalents of the claims are, moreover, within the scope of the present invention.

What is claimed is:

1. A LED device comprising:
a plurality of LED elements;
a first lead frame mounting at least one of the LED elements; and
a second lead frame,
wherein a thickness of a region in the first lead frame on which the at least one LED element is mounted is thicker than other locations in the first lead frame, and the thicker region is of the same material as the other locations of the first lead frame,
wherein the surface of the first lead frame on which the LED element is mounted is at the same level as the same surface of the second lead frame, and the thickness of the second lead frame in the region having the same surface is less than the thickness of the thicker region of the first lead frame on which the LED element is mounted,
wherein the thickness of the region for mounting the LED element in the first lead frame is from 0.5 mm to 0.6 mm, and the thickness at the other locations in the first lead frame is 0.3 mm, and
a recess containing the plurality of LED elements, wherein the second lead frame extends within the recess.

2. A LED device comprising:
a plurality of LED elements;
a first lead frame mounting at least one of the LED elements; and
a second lead frame;
wherein a thickness of a region for mounting the at least one LED element in the first lead frame is thicker than other locations in the first lead frame,
wherein the surface of the first lead frame on which the LED element is mounted is at the same level as the same surface of the second lead frame; and
a recess in the shape of a round shallow bowl and containing the plurality of LED elements,
wherein the second lead frame extends within the recess, and
wherein a bottom surface in the recess is composed of only respective exposed portions of the first lead frame and the second lead frame, and a portion of a package that forms the recess,
wherein the area of the bottom surface occupied by the first lead frame is greater than the area of the bottom surface occupied by the second lead frame, and the LED elements are equidistant from each other.

3. A LED device comprising:
a plurality of LED elements;
a first lead frame mounting at least one of the LED elements; and
a second lead frame,
wherein a thickness of a region in the first lead frame on which the at least one LED element is mounted is thicker than other locations in the first lead frame, and the thicker region is of the same material as the other locations of the first lead frame,
wherein the surface of the first lead frame on which the LED element is mounted is at the same level as the same surface of the second lead frame, and the thickness of the second lead frame is the region having the same surface is less than the thickness of the thicker region of the first lead frame on which the LED element is mounted,
wherein the thickness of the region for mounting the LED element in the first lead frame is from 0.5 mm to 0.6 mm, and
a recess containing the plurality of LED elements, wherein the second lead frame extends within the recess.

4. A LED device comprising:
a plurality of LED elements;
a first lead frame mounting at least one of the LED elements;
a second lead frame,
wherein a thickness of a region for mounting the at least one LED element in the first lead frame is thicker than other locations in the first lead frame,
wherein the surface of the first lead frame on which the LED element is mounted is at the same level as a top surface of the second lead frame, and
a recess in the shape of a round shallow bowl and containing the plurality of LED elements,
wherein the second lead frame extends within the recess,
wherein a bottom surface in the recess is composed of respective exposed portions of the first lead frame and the second lead frame, and a portion of a package that forms the recess,
wherein the area of the bottom surface occupied by the first lead frame is greater than the area of the bottom surface occupied by the second lead frame, and
wherein said plurality of LED elements includes a first LED element, a second LED element and a third LED element which are located apart from each other, and a distance between said first LED element and said second LED element is substantially equal to a distance between said second LED element and said third LED element.

* * * * *